(12) United States Patent
Zhang et al.

(10) Patent No.: US 11,063,134 B2
(45) Date of Patent: Jul. 13, 2021

(54) VERTICAL TRANSISTORS WITH TOP SPACERS

(71) Applicant: INTERNATIONAL BUSINESS MACHINES CORPORATION, Armonk, NY (US)

(72) Inventors: Jingyun Zhang, Albany, NY (US); Xin Miao, Slingerlands, NY (US); Choonghyun Lee, Rensselaer, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

(21) Appl. No.: 16/389,502

(22) Filed: Apr. 19, 2019

(65) Prior Publication Data

US 2020/0335605 A1 Oct. 22, 2020

(51) Int. Cl.
*H01L 29/66* (2006.01)
*H01L 21/28* (2006.01)
(Continued)

(52) U.S. Cl.
CPC ...... *H01L 29/66553* (2013.01); *H01L 21/283* (2013.01); *H01L 21/28123* (2013.01); *H01L 21/764* (2013.01); *H01L 21/823814* (2013.01); *H01L 21/823864* (2013.01); *H01L 21/823871* (2013.01); *H01L 21/823885* (2013.01);
(Continued)

(58) Field of Classification Search
CPC ..... H01L 21/823487; H01L 21/823814; H01L 21/823871; H01L 27/092; H01L 27/0847; H01L 27/088; H01L 27/0924; H01L 29/66666; H01L 29/7827; H01L 29/78642; H01L 29/0847; H01L 29/41741; H01L 29/4966; H01L 29/42392
See application file for complete search history.

(56) References Cited

U.S. PATENT DOCUMENTS 9,741,626 B1 8/2017 Cheng et al.
9,882,025 B1 1/2018 Zhang
(Continued)

OTHER PUBLICATIONS

Guo, "Spatial Resolution in Thin Film Deposition on Silicon Surfaces by Combining Silylation and UV/ozonlysis", Nanotechnology. vol. 25. Nov. 2014. pp. 1-10.

*Primary Examiner* — Joseph M Galvin, III
(74) *Attorney, Agent, or Firm* — Tutunjian & Bitetto, P.C.; L. Jeffrey Kelly

(57) ABSTRACT

Devices and methods for a vertical field effect transistor (VTFET) semiconductor device include recessing a gate dielectric and a gate conductor of a vertical gate structure below a top of a vertical fin to form openings between the top of the vertical fin and an etch stop layer, the top of the vertical fin being opposite to a substrate at a bottom of the vertical fin. A spacer material is deposited in the openings to form a spacer corresponding to each of the openings. Each spacer is recessed below the top of the vertical fin. A top spacer is selectively deposited in each of the openings to line the etch stop layer and the spacer such that the top of the vertical fin is exposed above the top spacer and the spacer is covered by the top spacer. A source/drain region is formed on the top of the vertical fin.

15 Claims, 7 Drawing Sheets

(51) Int. Cl.
  *H01L 21/283*  (2006.01)
  *H01L 21/764*  (2006.01)
  *H01L 21/8238*  (2006.01)
  *H01L 29/78*  (2006.01)
  *H01L 27/092*  (2006.01)
  *H01L 29/08*  (2006.01)
  *H01L 29/45*  (2006.01)
  *H01L 29/49*  (2006.01)

(52) U.S. Cl.
  CPC ........ *H01L 27/092* (2013.01); *H01L 29/0847* (2013.01); *H01L 29/45* (2013.01); *H01L 29/4991* (2013.01); *H01L 29/66666* (2013.01); *H01L 29/7827* (2013.01)

(56) References Cited

U.S. PATENT DOCUMENTS

| | | |
|---|---|---|
| 10,096,692 B1 | 1/2018 | Cheng et al. |
| 10,069,007 B2 | 9/2018 | Anderson |
| 2016/0336426 A1* | 11/2016 | Chang ................. H01L 29/6656 |
| 2017/0213737 A1* | 7/2017 | Cheng ............... H01L 21/28568 |
| 2018/0350932 A1* | 12/2018 | Liu .................. H01L 29/42376 |

\* cited by examiner

VERTICAL TRANSISTORS WITH TOP SPACERS

BACKGROUND

The present invention generally relates to vertical transistors, and more particularly to top spacer formation for vertical field effect transistors (VTFET).

VTFETs may facilitate decreasing the size of complimentary metal oxide semiconductor (CMOS) semiconductor devices. However, attempting to form spacers at a top side of a VTFET can result in low quality spacers with, e.g., seams in the spacers, thus decreasing device yields and device performance.

SUMMARY

In accordance with an embodiment of the present invention, a method for fabricating a vertical field effect transistor (VTFET) semiconductor device. The method includes recessing a gate dielectric and a gate conductor of a vertical gate structure below a top of a vertical fin to form at least one opening between the top of the vertical fin and an etch stop layer, the top of the vertical fin being opposite to a substrate at a bottom of the vertical fin. A spacer material is deposited in the at least one opening to form a spacer corresponding to each of the at least one opening. Each spacer is recessed below the top of the vertical fin. A top spacer is selectively deposited in each of the at least one opening to line the etch stop layer and the spacer such that the top of the vertical fin is exposed above the top spacer and the spacer is covered by the top spacer. A source/drain region is formed on the top of the vertical fin.

In accordance with another embodiment of the present invention, a method for fabricating a vertical field effect transistor (VTFET) semiconductor device. The method includes forming a vertical gate structure on a substrate, the vertical gate structure including a vertical fin with a gate dielectric and a gate conductor on vertical sidewalls of the vertical fin. A nitride etch stop layer is formed on the gate conductor. The gate dielectric and the gate conductor are recessed below a top of the vertical fin to form at least one opening between the top of the vertical fin and the etch stop layer, the top of the vertical fin being opposite to the substrate at a bottom of the vertical fin. A spacer material is deposited in the at least one opening to form a spacer corresponding to each of the at least one opening until the spacer material converges in a middle portion of the opening to pinch off a seam in the spacer. Each spacer is recessed below the top of the vertical fin. A top spacer is selectively deposited on nitride materials in the at least one opening such that the top of the vertical fin is exposed above the top spacer and the seam in the spacer is covered by the top spacer. A source/drain region is formed on the top of the vertical fin. A contact is patterned over the source/drain region.

In accordance with another embodiment of the present invention, a vertical field effect transistor (VTFET) semiconductor device. The device includes a vertical gate structure with a gate dielectric and a gate conductor disposed on vertical sidewalls of the vertical gate structure below a top of a vertical fin to form at least one opening between the top of the vertical fin and an etch stop layer, the top of the vertical fin being opposite to a substrate at a bottom of the vertical fin. A spacer is in the at least one opening below the top of the vertical fin. A top spacer is in each of the at least one opening lining the etch stop layer and the spacer such that the top of the vertical fin is exposed above the top spacer and the spacer is covered by the top spacer. A source/drain region is on the top of the vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
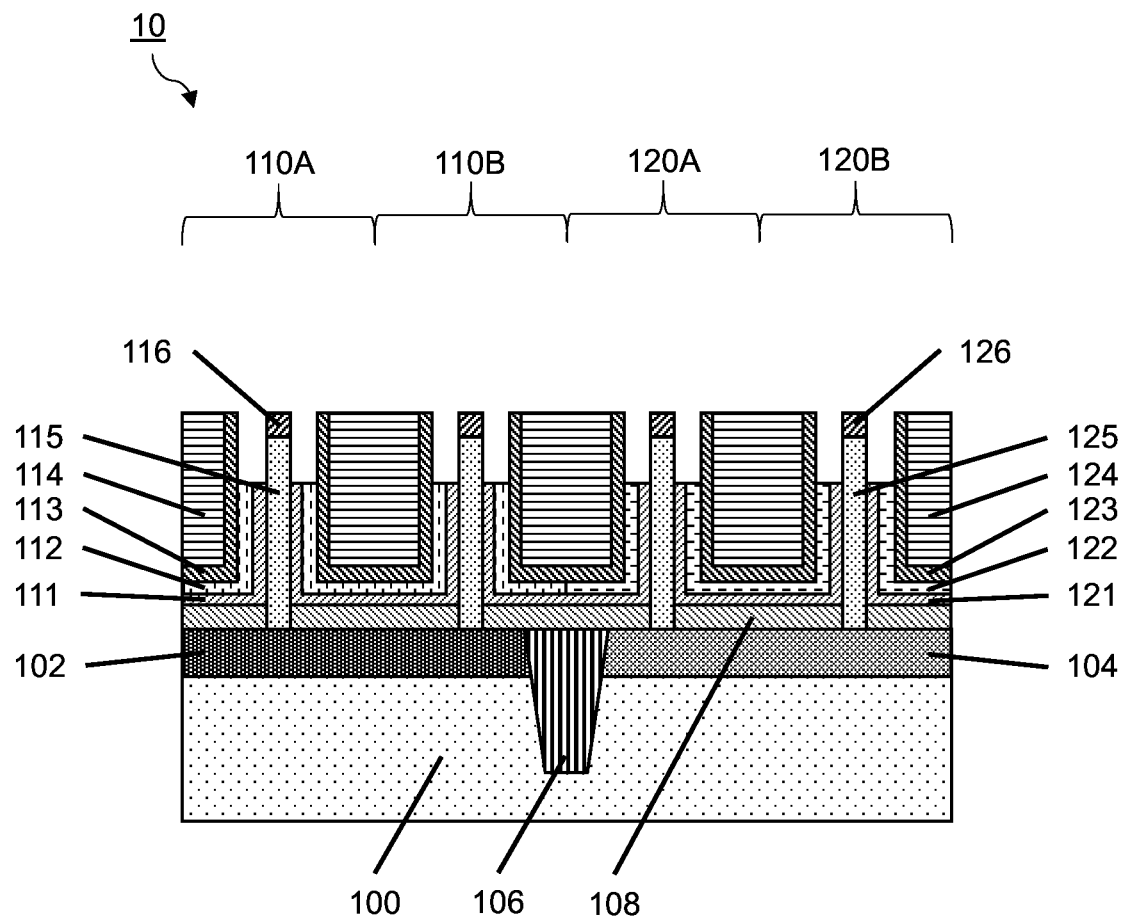
FIG. 1 is a cross-sectional view showing a device with vertical field effect transistors (VTFETs) with openings on opposing sides of each vertical fin, in accordance with an embodiment of the present invention.

According to an embodiment of the present invention, a VTFET is described that forms top spacers with high spacer quality and device yields.

A VTFET device is formed with openings on each side of a vertical fin. A spacer material is deposited over the device to fill the openings. However, the spacer material deposition can form seams in the spacer material within the openings because the spacer material is depositing along the vertical sidewalls of the opening. As the spacer material is deposited, the spacer material from each vertical sidewall of the opening extend towards each other, eventually pinching off at a seam.

To prevent the seams and any voids from not fully pinched off spacer material from causing faults in the device, the spacer material is recessed below a top portion of the vertical fin. A selective deposition process is then used to reform a uniform top spacer in the opening over the spacer material, thus blocking the seam and preventing conductive material from being formed therein. Accordingly, shorts can be prevented from faulty or low quality top spacers. As a result, the top spacer is robust without the need for fin trimming or fin oxidation. As a result, device yields are improved and device performance is increased with better reliability.

Exemplary applications/uses to which the present invention can be applied include, but are not limited to: semiconductor devices utilizing transistors, such as, e.g., vertical field effect transistors (VTFET) for processing devices, memory devices, and data storage devices, among others.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIG. 1t will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view showing a device with vertical field effect transistors (VTFETs) with openings on opposing sides of each vertical fin is depicted according to an embodiment of the present invention.

According to an embodiment of the present invention, a semiconductor device 10 is described with one or more vertical field effect transistors (VTFETs) gate structures 110A, 110B, 120A and 120B formed thereon. In some embodiments, the device 10 has both n-type and p-type VTFETs, however, the present invention also contemplates a device 10 with one or more VTFETs of only an n-type or a p-type.

In at least one possible embodiment, the device 10 has n-type gate structures 110A and 110B formed on an n-type semiconductor layer 102 over a substrate 100. The substrate 100 can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The n-type semiconductor 102 can form an n-type source/drain region for the gate structures 110A and 110B. In a silicon containing n-type semiconductor layers 102, examples of n-type dopants, i.e., impurities, include but are not limited to antimony, arsenic and phosphorous.

The n-type semiconductor 102 can be formed by, e.g., deposition or epitaxial growth of a semiconductor with in situ or subsequent implantation of n-type dopants. Alternatively, the n-type semiconductor 102 can be a doped portion of the substrate 100. For example, the substrate 100 can include silicon. A top surface of the substrate 100 can be dopant with an ion implantation process to implant, e.g., phosphorous ions into a layer of the substrate 100 and form the n-type semiconductor 102.

Similarly, a p-type semiconductor 104 is formed over the substrate 100 by, e.g., depositing a layer of a semiconductor material on the substrate 100 with in situ or subsequent implantation of p-type dopants. Examples of p-type dopants, i.e., impurities, include but are not limited to: boron, aluminum, gallium and indium. In at least one possible embodiment, the p-type semiconductor 104 includes a deposited or epitaxially grown silicon germanium layer with boron dopants. Similar to the n-type semiconductor 102, the p-type semiconductor 104 can operate a source/drain region to provide or receive a current through a vertical channel formed thereon.

To facilitate preventing interference and current leakage between the n-type semiconductor 102 and the p-type semiconductor 104, a shallow trench isolation (STI) region 106 can be formed therebetween. The STI region 106 can be formed, e.g., by etching a trenching into the semiconductors 102 and 104 and the substrate 100, and filling the trench with an insulating material, such as, e.g., a high-k dielectric such as a suitable oxide or nitride.

Gates can then be formed over the n-type semiconductor 102 and p-type semiconductor 104. In one or more embodiments, one or more vertical fins 115, 125 can be formed over the substrate 100. The vertical fins 115 are formed over the n-type semiconductor 102 while the vertical fins 125 are formed over the p-type semiconductor 104. The vertical fins 115, 125 can be formed by epitaxial growth and/or direc-tional etching, for example, by reactive ion etching (RIE). In various embodiments, the vertical fins 115, 125 can be formed by an image transfer process, for example, a sidewall image transfer (SIT), also referred to as Self-Aligned Double Patterning (SADP), a Self-aligned triple patterning (SATP) process, a Self-Aligned Quadruple Patterning (SAQP) process, or a combination thereof. In various embodiments, the vertical fins can be formed by a direct-write process, for example, using extreme ultraviolet (EUV) lithography, electron beam lithography, or x-ray lithography.

To facilitate the reduction of current leakage and interference between fins 115 and 125, a bottom spacer 108 is formed between each vertical fin 115, 125. In one embodiment, the at last one bottom spacer 108 is be formed by using a blanket layer deposition, such as chemical vapor deposition, and an anisotropic etch-back method. The at least one bottom spacer 108 may have a width ranging from about 6.0 nm to about 15.0 nm and a thickness of about 4 nm to about 10 nm, and may be composed of a dielectric, such as a nitride, oxide, oxynitride, or a combination thereof.

A layer of gate dielectric 111 in the n-type gate structures 110A and 110B, and a layer of gate dielectric 121 in the p-type gate structures 120A and 120B, such as an oxide, nitride, oxynitride or any combination thereof, is then formed on the surfaces of device 10 utilizing a deposition process. For example, a deposition process such as chemical vapor deposition (CVD), plasma-assisted CVD, evaporation and chemical solution deposition may be employed, or alternatively, a thermal process such as oxidation, nitridation, and oxynitridation, may be used in growing the gate dielectric 111 and 121 on the surface of device 10.

The thickness of the gate dielectric 111 and 121 is not critical to the present invention. But according to aspects of the present invention, the gate dielectric 111 and 121 has a thickness of from about 1 to about 10 nm, with a thickness of from about 1.5 to about 2.5 nm being more highly preferred. It is noted that the gate dielectric 111 and 121 employed in the present invention may be a dielectric material such as $SiO_2$ or $Al_3N_4$, or alternatively high-k dielectrics such as oxides of Ta, Zr, Al or combinations thereof may also be employed.

After gate dielectric 111 and 121 has been formed, gate conductors 112 and 122 are formed atop gate dielectric 111 and 121, respectively, by a deposition process (such as CVD, plasma-assisted CVD, plating, sputtering and etc.) followed by planarization. Gate conductors 112 and 122 may comprise any conductive material including but not limited to: polysilicon; a conductive elemental metal such as W, Cu, Pt, Ag, Au, Ru, Jr, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials.

According to at least one embodiment, the gate conductor 112 and the gate conductor 122 are different materials. For example, the gate conductor 112 can be, e.g., a conductive material with a n-type work function. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type gate structures 110A and 110B. The "conduction band" is the lowest lying electron energy band of the doped material that is not completely filled with electrons. In one embodiment, the work function of the n-type gate conductors 112 ranges from 4.1 eV to 4.3 eV. In one embodiment, the n-type gate conductors 112 is composed of at least one of TiAl, TanN, TiN, HfN, HfSi, or combinations thereof.

The gate conductor 122 can be, e.g., a conductive material with a p-type work function. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on the p-type gate structures 120A and 120B, by making the channel of the device conductive. The p-type work function metal layer of the gate conductor 122 may be composed of titanium and their nitrided/carbide. In one embodiment, the gate conductor 122 is composed of titanium nitride (TiN). The p-type work function metal layer may also be composed of TiAlN, Ru, Pt, Mo, Co and alloys and combinations thereof.

An etch stop layer 113 and 123 can line each of the gate structures 110A, 110B, 120A and 120B. The etch stop layer 113 and 123 can include a suitable masking material to protect layers from processing. The etch stop layer 113 and 123 can include soft and/or hardmask materials and can be formed using deposition, photolithography and etching. In one embodiment, the etch stop layer 113 and 123 is a hardmask composed of a nitride-containing material, such as silicon nitride. It is noted that it is not intended that the etch stop layer 113 and 123 be limited to only silicon nitride, as the composition of the hardmask may include any dielectric material that may be deposited by chemical vapor deposition (CVD) and related methods. Other hardmask compositions for the etch stop layer 113 and 123 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

The device 10 can then be buried in a dielectric fill 114 and 124. The dielectric fill 114 of the n-type gate structures 110A and 110B and the dielectric fill 124 of the p-type gate structures 120A and 120B can include the same or different materials. The dielectric fill 114 and 124 can include a material for isolating the gate structures 110A, 110B, 120A and 120B. As a result the dielectric fill 114 and 124 can include, e.g., a dielectric, such as a high-k dielectric or other suitable dielectric. For example, the dielectric fill 114 and 124 can be a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

The dielectric fill 114 and 124 can be formed to a thickness over the substrate 100 by a deposition process followed by an etch-back or planarization process. Thus, the dielectric fill 114 and 124 forms a planar surface along tops of the gate structures 110A, 110B, 120A and 120B with the fins 115 and 125, etch stop layer 113 and 123, gate conductor 112 and 122, and the gate dielectric 111 and 121 exposed.

However, tops of the fins 115 and 125 can be protected from processing with a hard mask 116 and 126, respectively. By employing a hard mask 116 and 126, top portions of the gate conductor 112 and 122, and the gate dielectric 111 and 121 can be recessed to below tops of the fins 115 and 125 without damaging the fins 115 and 125. Thus, a recess between the fins 115 and 125 and the etch stop layer 113 and 123 can be formed. The etch process can be a selective etch process including, e.g., anisotropic etching such as RIE. The etch process is selective to the hard mask 116 and 126, the etch stop layer 113 and 123 and the fins 115 and 125. Accordingly, the hard mask 116 and 126 can include, e.g., silicon oxide (SiO), silicon nitride (SiN), silicon oxynitride (SiON), silicon boronitride (SiBN), or a combination thereof.

Figure 2:
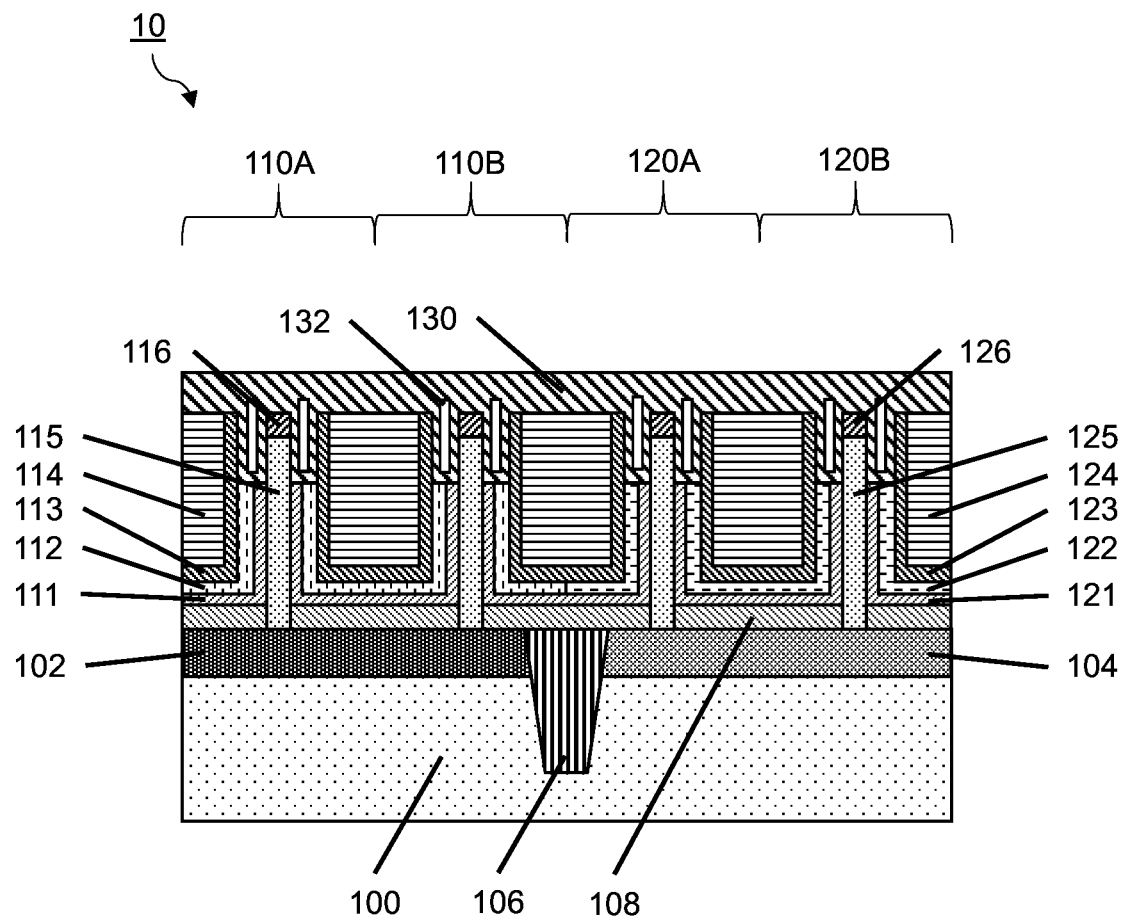
FIG. 2 is a cross-sectional view showing a device with recessing on each side of the vertical fins filled with a spacer material, in accordance with an embodiment of the present invention.

Referring now to FIG. 2, a cross-sectional view showing a device with recessing on each side of the vertical fins filled with a spacer material is depicted according to an embodiment of the present invention.

A spacer material 130 is formed over the device 10. The spacer material 130 can facilitate isolating the gate conductors 112 and 122. Isolation can be enhanced using a material including, e.g., a dielectric, such as the dielectrics described above. Thus the spacer material 130 can be an insulating material that prevents current and/or voltage in the gate conductors 112 and 122 from shorting against other components at a top side (opposite to the substrate 100) of the device 10.

The spacer material 130 can be formed with a deposition or growth process, such as, e.g., atomic layer deposition (ALD). Thus, the spacer material 130 increases in thickness relative to both horizontal and vertical deposition surfaces during the deposition process. As a result, in areas, such as the recess around the tops of the fins 115 and 125, the spacer material 130 is increasing in thickness from multiple directions towards a middle area. As the spacer material 130 is deposited, the middle area with be pinched off by two or more sides of the spacer material 130 meeting each other. The pinching off can form a seam or a void 132 in the middle areas pinched off by material deposition, such as, e.g., in the recessed areas around the fins 115 and 125.

The seams 132 can provide a potential failure mechanism for the device 10 by reducing the isolation of the gate conductors 112 and 122. For example, the spacer material 130 could be planarized with source/drain regions or electrodes formed over the gate structures 110A, 110B, 120A and 120B. As a result, the material of the source/drain regions or electrodes could enter the seams 132 provide a conduction path from the gate conductors 112 and 122 that could ultimately short the device 10.

Figure 3:
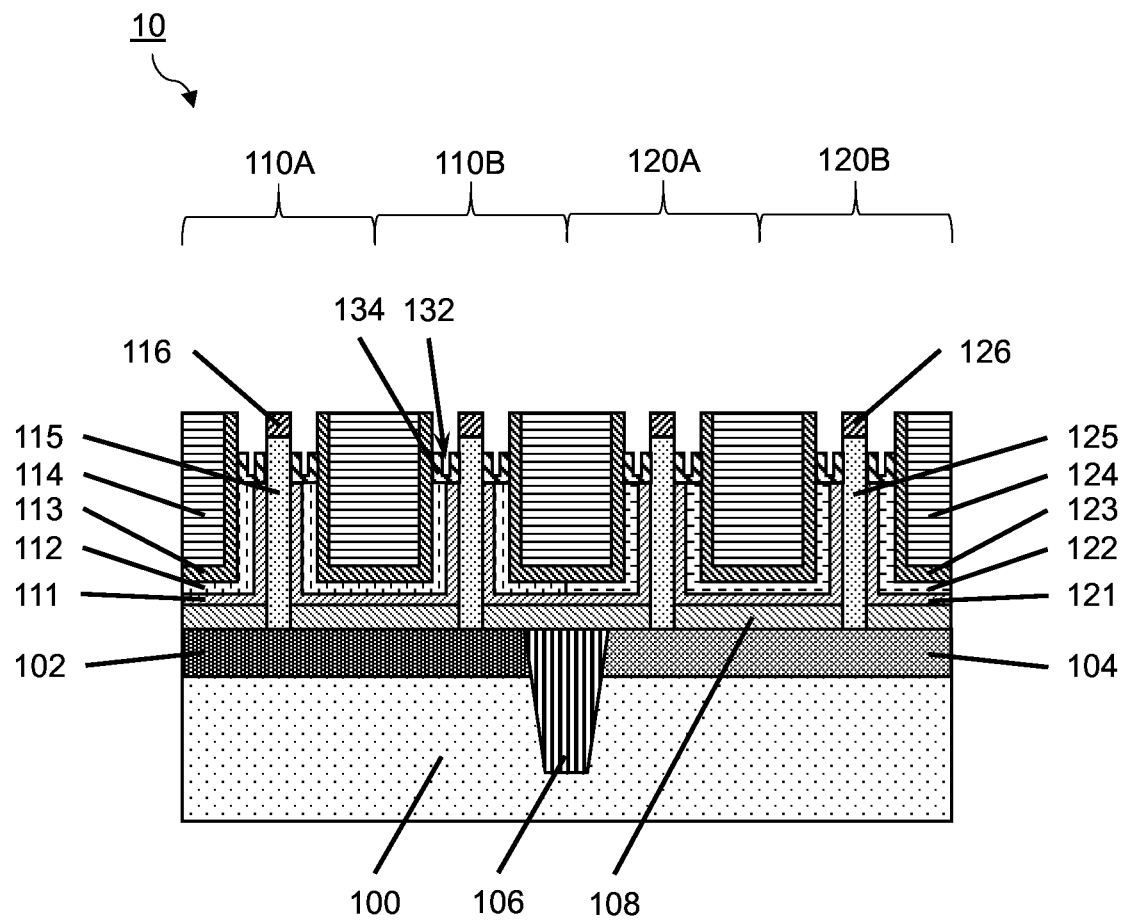
FIG. 3 is a cross-sectional view showing a device with a spacer material recessed below top portions of vertical fins, in accordance with an embodiment of the present invention.

Referring now to FIG. 3, a cross-sectional view showing a device with a spacer material recessed below top portions of vertical fins is depicted according to an embodiment of the present invention.

To facilitated the prevention of shorts in the device 10, the spacer material 130 is etched back to a level below the tops of the fins 115 and 125. For example, the spacer material 130 can be recessed down to the etch stop layer 113/123 and the hard masks 116/126 via, e.g., planarization, such as chemical mechanical planarization (CMP). Alternatively, the etch process can be a selective and anisotropic etching, such as, e.g., RIE, selective to the fins 115 and 125 and the hard masks 116 and 126. Thus, bottom portions of the recessed arounds around the tops of the fins 115 and 125, including the gate conductors 112 and 122 and the gate dielectrics 111 and 121, are lined with spacers 134 while the tops of the fins 115 and 125 are exposed on the sides. The etch back of the spacer material 130 to form the spacers 134 also exposes the seams 132.

Figure 4:
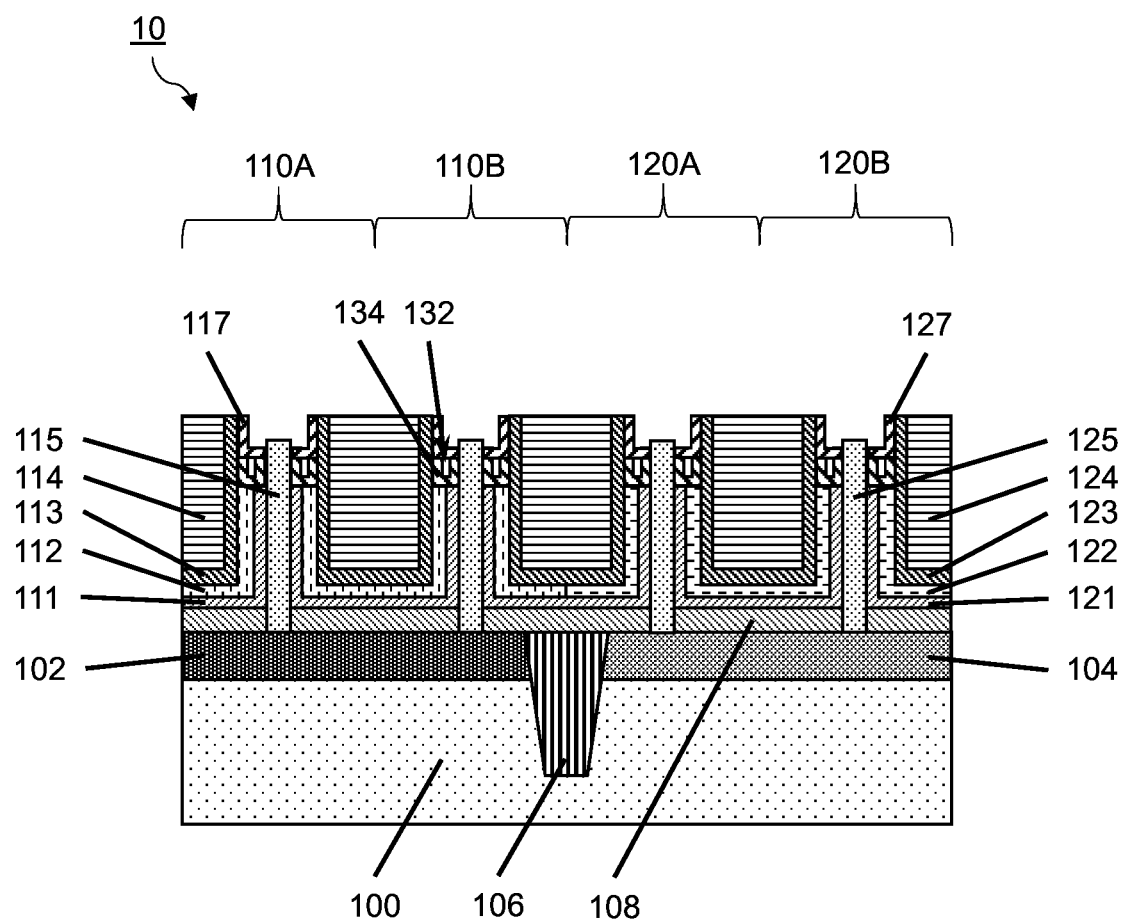
FIG. 4 is a cross-sectional view showing a device with top spacers formed over the spacer material on each side of the vertical fins to block off seams in the spacer material, in accordance with an embodiment of the present invention.

Referring now to FIG. 4, a cross-sectional view showing a device with top spacers formed over the spacer material on each side of the vertical fins to block off seams in the spacer material is depicted according to an embodiment of the present invention.

The exposed seams 132 of the spacers 134 can be blocked off to prevent conductive material from infiltrating the seams 132 and to increase isolation of the gate conductors 112 and 122. The seams 132 can be blocked off by depositing an additional top spacer 117 and/or 127 for the n-type gate structures 110A and 110B and the p-type gate structures 120A and 120B, respectively.

The top spacers 117 and 127 can be formed by depositing the top spacer material in the recessed portions around the fins 115 and 125, respectively. However, depositing the top spacer material in a similar manner to the spacer material described above may result in a similar pinching off to form a seam and would also cover the top portion of the fins 115 and 125. To facilitate isolation of the gate conductors 112 and 122 while leaving exposed the tops of the fins 115 and 125, the top spacer material can be, e.g., selectively deposited. For example, possible embodiments of the present invention include deposition of the top spacer material by selective atomic layer deposition (ALD) via silylation. Thus, according to at least one embodiment, the fins 115 and 125 include a silicon material. The silicon of the fins 115 and 125 forms a native oxide including silicon dioxide ($SiO_2$) by exposure to oxygen. Silylation can be used to convert OH molecules bonded to the $SiO_2$ surface to O—Si—$[R]_3$ molecules. This silylation process blocks the formation of bond between a deposited top spacer material and the fins 115 and 125. As a result, the top spacer material can then be formed via ALD such that the top spacer material is selectively deposited on the nitride materials of the etch stop layers 113 and 123. According to one possible embodiment, the spacers 134 also include a nitride material such that the top spacer material is also deposited on the spacers 134 to effectively block the seams 132. As a result, top spacers 117 and 127 are formed over the spacers 134 while leaving the tops of the fins 115 and 125 exposed for subsequent processing.

Figure 5:
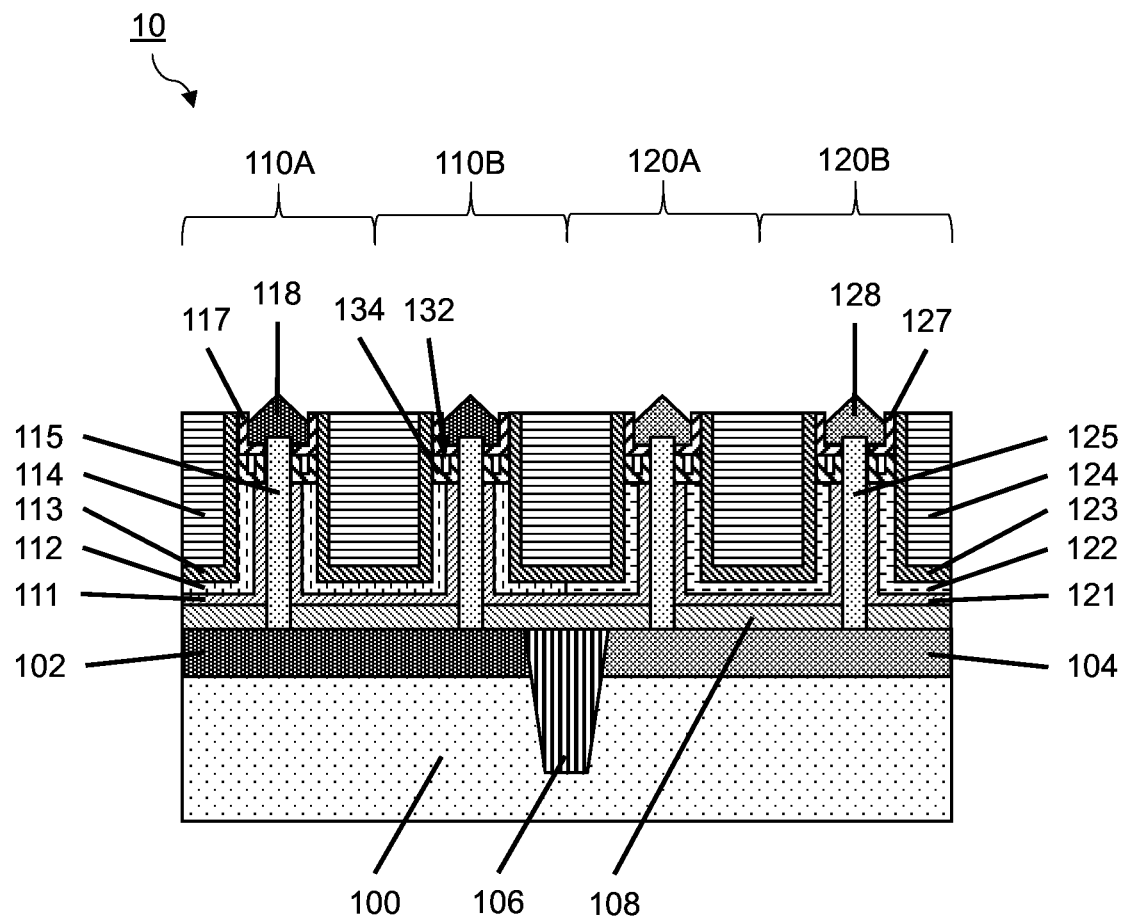
FIG. 5 is a cross-sectional view showing a device with source/drain regions formed on top portions of vertical fins between top spacers to form vertical transistors, in accordance with an embodiment of the present invention.

Referring now to FIG. 5, a cross-sectional view showing a device with source/drain regions formed on top portions of vertical fins between top spacers to form vertical transistors is depicted according to an embodiment of the present invention.

Source/drain regions 118 and 128 are formed over the fins 115 and 125, respectively. Thus, gates for the gate structures 110A, 110B, 120A and 120B can be actuated to conducted a signal between the n-type semiconductor 102 and the source/drain regions 118, and between the p-type semiconductor 104 and the source/drain regions 128. As such, the source/drain regions 118 and 128 are formed around and in contact with the exposed tops of the fins 115 and 125.

The source/drain regions 118 can include, e.g., a n-type conducting material, such as, e.g., an n-type compatible metal, an n-doped semiconductor, or other suitable conducting material for n-type VTFETs. Similarly, the source/drain regions 128 can include, e.g., a p-type conducting material, such as, e.g., an p-type compatible metal, an p-doped semiconductor, or other suitable conducting material for p-type VTFETs.

The source/drain regions 118 and 128 are formed via, e.g., a deposition process, such as those described above, including, e.g., CVD or epitaxially growth. Where doped semiconductors are used to form the source/drain regions 118 and 128, the doping can be performed either in-situ or by and implantation process after growth or deposition of the semiconductor material, such as, e.g., ion implantation.

Figure 6:
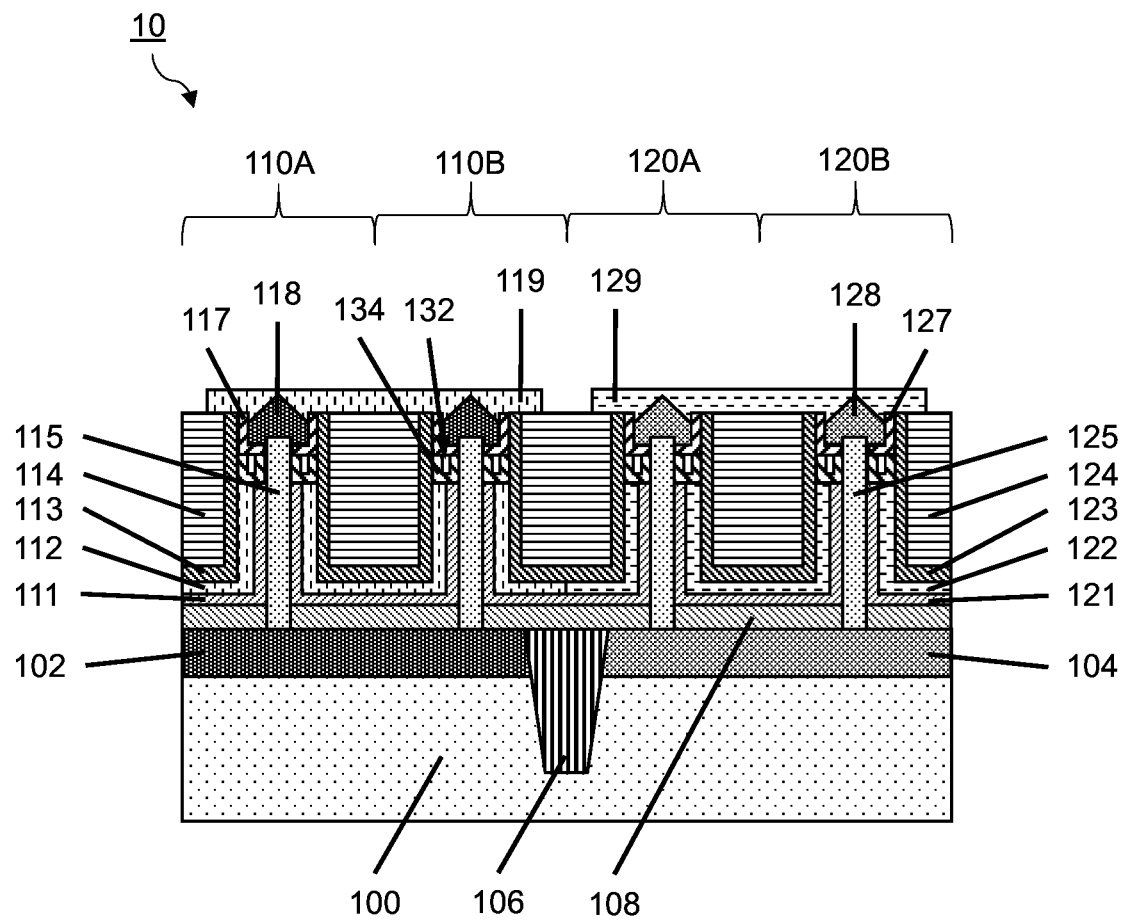
FIG. 6 is a cross-sectional view showing a device with electrodes formed over vertical transistors, in accordance with an embodiment of the present invention.

Referring now to FIG. 6, a cross-sectional view showing a device with electrodes formed over vertical transistors is depicted according to an embodiment of the present invention.

According to an embodiment of the present invention, an electrical signal can be provided to the n-type gate structures 110A and 110B with an electrode 119. The electrode 119 can be a conductive material with an n-type compatible work function, such as, e.g., the n-type metals described above with reference to the gate conductor 112. The electrode 119 and the gate conductor 112 can include the same or different materials.

Similarly, an electrical signal can be provided to the p-type gate structures 120A and 120B with an electrode 129. The electrode 129 can be a conductive material with an p-type compatible work function, such as, e.g., the p-type metals described above with reference to the gate conductor 122. The electrode 129 and the gate conductor 122 can include the same or different materials.

The electrodes 119 and 129 may be deposited with a screen printing technique or other deposition process. In another embodiment, the electrodes 119 and 129 is provided by the application of an etched or electroformed metal pattern.

Figure 7:
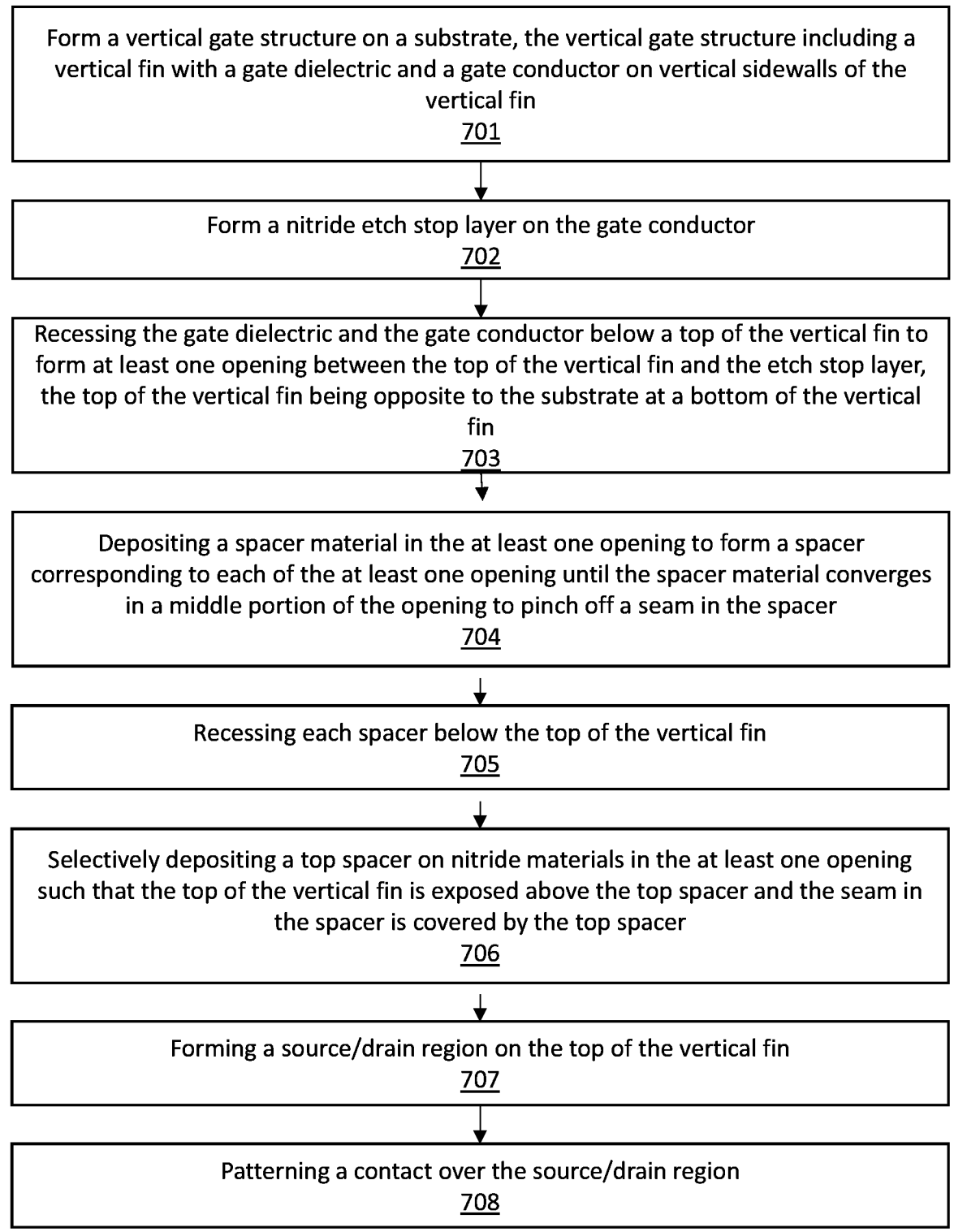
FIG. 7 is a block/flow diagram showing a system/method for forming VTFET devices with uniform top spacers formed at top portions of vertical fins, in accordance with an embodiment of the present invention.

Referring now to FIG. 7, a block/flow diagram showing a system/method for forming VTFET devices with uniform top spacers formed at top portions of vertical fins is depicted according to an embodiment of the present invention.

At block 701, form a vertical gate structure on a substrate, the vertical gate structure including a vertical fin with a gate dielectric and a gate conductor on vertical sidewalls of the vertical fin.

At block 702, form a nitride etch stop layer on the gate conductor.

At block 703, recess the gate dielectric and the gate conductor below a top of the vertical fin to form at least one opening between the top of the vertical fin and the etch stop layer, the top of the vertical fin being opposite to the substrate at a bottom of the vertical fin.

At block 704, deposit a spacer material in the at least one opening to form a spacer corresponding to each of the at least one opening until the spacer material converges in a middle portion of the opening to pinch off a seam in the spacer.

At block 705, recess each spacer below the top of the vertical fin.

At block 706, selectively deposit a top spacer on nitride materials in the at least one opening such that the top of the vertical fin is exposed above the top spacer and the seam in the spacer is covered by the top spacer.

At block 707, form a source/drain region on the top of the vertical fin.

At block 708, pattern a contact over the source/drain region.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a vertical field effect transistor (VTFET) semiconductor device, the method comprising:
   recessing a gate dielectric and a gate conductor of a vertical gate structure below a top of a vertical fin to form at least one opening between the top of the vertical fin and an etch stop layer, the top of the vertical fin being opposite to a substrate at a bottom of the vertical fin;
   depositing a spacer material in the at least one opening to form a spacer corresponding to each of the at least one opening;
   recessing each spacer below the top of the vertical fin;
   selectively depositing a top spacer in each of the at least one opening to line the etch stop layer and the spacer such that the top of the vertical fin is exposed above the top spacer and the spacer is covered by the top spacer; and
   forming a source/drain region on the top of the vertical fin.

2. The method as recited by claim 1, further including forming the vertical gate structure on the substrate, including:
   depositing the gate dielectric on vertical sidewalls of the vertical fin;
   depositing the gate conductor on the gate dielectric; and
   depositing the etch stop layer on the gate conductor.

3. The method as recited by claim 1, wherein the etch stop layer includes a nitride material.

4. The method as recited by claim 3, wherein selectively depositing the top spacer including selectively depositing the top spacer on nitride materials.

5. The method as recited by claim 1, further including forming the vertical gate structure on a doped semiconductor layer.

6. The method as recited by claim 1, further including forming a contact over the source/drain region.

7. The method as recited by claim 1, wherein forming the spacer further includes:
   depositing the spacer material over the vertical gate structure until the spacer material converges in a middle portion of the opening to pinch off a seam in the spacer;
   planarizing the spacer material down to the etch stop layer to leave the spacer in the at least one opening.

8. The method as recited by claim 7, wherein selectively depositing the top spacer blocks the seam by forming a layer over the spacer.

9. The method as recited by claim 1, further including depositing a dielectric fill around the vertical gate structure.

10. A method for fabricating a vertical field effect transistor (VTFET) semiconductor device, the method comprising:
    forming a vertical gate structure on a substrate, the vertical gate structure including a vertical fin with a gate dielectric and a gate conductor on vertical sidewalls of the vertical fin;
    forming a nitride etch stop layer on the gate conductor;
    recessing the gate dielectric and the gate conductor below a top of the vertical fin to form at least one opening between the top of the vertical fin and the etch stop layer, the top of the vertical fin being opposite to the substrate at a bottom of the vertical fin;
    depositing a spacer material in the at least one opening to form a spacer corresponding to each of the at least one opening until the spacer material converges in a middle portion of the opening to pinch off a seam in the spacer;
    recessing each spacer below the top of the vertical fin;
    selectively depositing a top spacer on nitride materials in the at least one opening such that the top of the vertical fin is exposed above the top spacer and the seam in the spacer is covered by the top spacer;
    forming a source/drain region on the top of the vertical fin; and
    patterning a contact over the source/drain region.

11. The method as recited by claim 10, further including forming the vertical gate structure on the substrate, including:
    depositing the gate dielectric on the vertical sidewalls of the vertical fin;
    depositing the gate conductor on the gate dielectric; and
    depositing the etch stop layer on the gate conductor.

12. The method as recited by claim 10, further including forming the vertical gate structure on a doped semiconductor layer.

13. The method as recited by claim 10, wherein forming the spacer further includes planarizing the spacer material down to the etch stop layer to leave the spacer in the at least one opening.

14. The method as recited by claim 10, wherein selectively depositing the top spacer blocks the seam by forming a layer over the spacer.

15. The method as recited by claim 10, further including depositing a dielectric fill around the vertical gate structure.

* * * * *